United States Patent [19]
Sekariapuram et al.

[11] Patent Number: 5,943,267
[45] Date of Patent: Aug. 24, 1999

[54] HIGH-DENSITY NONVOLATILE MEMORY CELL

[75] Inventors: Seshan Sekariapuram, Fremont; Raminda U. Madurawe, Sunnyvale, both of Calif.

[73] Assignee: Altera Corporation, San Jose, Calif.

[21] Appl. No.: 09/097,317

[22] Filed: Jun. 12, 1998

Related U.S. Application Data

[62] Division of application No. 08/855,808, May 12, 1997
[60] Provisional application No. 60/017,570, May 16, 1996.

[51] Int. Cl.$^6$ .................................................. G11C 11/34
[52] U.S. Cl. .......................... 365/185.28; 365/185.24; 365/185.14; 365/185.26
[58] Field of Search ........................ 365/185.01, 185.18, 365/185.15, 185.28, 185.24, 185.26, 185.14; 257/315, 316, 321

[56] References Cited

U.S. PATENT DOCUMENTS

| | | | |
|---|---|---|---|
| 4,929,988 | 5/1990 | Yoshikawa | 357/23.5 |
| 5,078,498 | 1/1992 | Kadakia et al. | 357/23.4 |
| 5,135,879 | 8/1992 | Richardson | 437/43 |
| 5,146,426 | 9/1992 | Mukherjee et al. | 365/149 |
| 5,258,634 | 11/1993 | Yang | 257/316 |
| 5,281,548 | 1/1994 | Prall | 437/43 |
| 5,315,142 | 5/1994 | Acovic et al. . | |
| 5,330,920 | 7/1994 | Soleimani et al. | 437/24 |
| 5,338,953 | 8/1994 | Wake | 267/316 |
| 5,343,063 | 8/1994 | Yuan et al. . | |
| 5,380,672 | 1/1995 | Yuan et al. . | |
| 5,386,132 | 1/1995 | Wong | 257/316 |
| 5,429,970 | 7/1995 | Hong . | |
| 5,476,801 | 12/1995 | Keshtbod . | |
| 5,479,368 | 12/1995 | Keshtbod . | |
| 5,486,714 | 1/1996 | Hong . | |
| 5,494,838 | 2/1996 | Chang et al. | 437/43 |
| 5,506,431 | 4/1996 | Thomas | 365/185.15 |
| 5,534,456 | 7/1996 | Yuan et al. . | |
| 5,576,567 | 11/1996 | Mori | 257/316 |
| 5,587,340 | 12/1996 | Yamazaki | 437/203 |
| 5,675,161 | 10/1997 | Thomas | 257/316 |
| 5,717,635 | 2/1998 | Akatsu | 365/185.05 |
| 5,780,341 | 7/1998 | Ogura | 438/259 |
| 5,835,409 | 11/1998 | Lambertson | 365/185.15 |

FOREIGN PATENT DOCUMENTS 401291470  11/1989  Japan ..................................... 257/316

OTHER PUBLICATIONS

Kim, et al., "A Novel Dual String NOR (DuSNOR) Memory Cell Technology Scalable to the 256 Mbit and 1Gbit Flash Memories," IEEE 0–7803–2700–4, IEDM 95, pp. 263–266.

Yamauchi, et al., "A New Cell Structure for Sub–quarter Micron High Density Flash Memory," IEEE 0–7803–2700–4, IEDM 95, pp. 267–269.

Aritome, et al., "A Novel Side–Wall Transfer–Transistor Cell (SWaTT Cell) for Multi–Level NAND EEPROMs," IEEE 0–7803–2700–4, IEDM 95, pp. 275–278.

Hanafi, et al., "A Scalable Low Power Vertical Memory," IEEE 0–7803–2700–4, IEDM 95, pp. 657–660.

*Primary Examiner*—Viet Q. Nguyen
*Attorney, Agent, or Firm*—Townsend and Townsend and Crew LLP

[57] ABSTRACT

A compact nonvolatile programmable memory cell. The memory cell has a floating gate (118), control gate (123), drain (108), and source regions (112). The memory cell is an electrically erasable programmable read only memory (EEPROM) cell or a Flash memory cell. Data may be stored the memory cell of the present invention for the required lifetime of the memory cell usage, and data is retained even when power is removed. The memory cell of the present invention has a substantially transverse or vertical channel (140), relative to a surface of a substrate. The memory may be used to create very high-density memory arrays.

32 Claims, 9 Drawing Sheets

Top View a. Etch Silicon Trench
b. Etch Oxide Regions

Cross-Section A-A

Cross-Section B-B

HIGH-DENSITY NONVOLATILE MEMORY CELL

This application is a division of U.S. patent application Ser. No. 08/855,808, filed May 12, 1997, which claimed the benefit of U.S. Provisional Application No. 60/017,570, filed May 16, 1996, all of which are incorporated herein by reference.

BACKGROUND OF THE INVENTION

The present invention relates to the field of semiconductor devices, and more specifically, to nonvolatile programmable memory cells.

Memory cells are used in the implementation of many types of electronic devices and integrated circuits. These devices include microprocessors, static random access memories (SRAMs), erasable-programmable read only memories (EPROMs), electrically erasable programmable read only memories (EEPROMs), Flash EEPROM memories, programmable logic devices (PLDs), field programmable gate arrays (FPGAs), application specific integrated circuits (ASICs), among others. Memory cells are used to store the data and other information for these and other integrated circuits. Moreover, integrated circuits with memory cells are used in a wide range of applications including computers, multimedia, telecommunications, networking, consumer electronics, industrial, automotive, satellites, and many others.

As integrated circuit and semiconductor processing technologies continue to advance, there is a need for greater densities and functionality in integrated circuits. These are often determined in a large part by the size and structure of the memory cells. Further, it is desirable that the memory cells have improved operating characteristics, such as lower power consumption, nonvolatility, reprogrammability, greater device longevity, improved data retention, better transient performance, superior voltage and current attributes, and improvements in other similar attributes.

As can be seen, an improved nonvolatile programmable memory cell is needed, especially structures and techniques for fabricating a higher density memory product.

SUMMARY OF THE INVENTION

An improved nonvolatile programmable memory cell is provided by virtue of the present invention. The memory cell has a floating gate, control gate, drain, and source regions. The memory cell maybe an electrically erasable programmable read only memory (EEPROM) cell or a Flash memory cell. Data may be stored in the memory cell of the present invention for the required lifetime of the memory cell usage, and data is retained even when power is removed. The memory cell of the present invention has a substantially transverse or vertical channel, relative to a surface of a substrate. Hence, the lateral dimensions of the memory cell of the present invention can be made very small since they do not depend on the ability to achieve narrow channel lengths. Accordingly, the memory cell of the present invention is very compact and very high-density memory arrays may be formed.

In particular, the memory cell may be fabricated in a trench, and the channel would be formed along a sidewall of the trench. The floating gate and control gate would be substantially parallel to the sidewalls of the trench. Two memory cells may be formed within the trench region, where the memory cells are mirror images of another and on opposite sidewalls. The drain region would be formed on the surface of the substrate, in proximity to, or adjacent to the sidewall. The source region would be formed beneath the bottom of the trench. The memory cell may be programmed to a high VT state using channel hot-electron injection, while the memory cell may be erased to a low VT state using Fowler-Nordheim tunneling. The memory cell may also be programmed and erased by high-voltage injection in both directions.

In a specific embodiment, the present invention is a semiconductor device including a drain region formed on a top surface of a substrate. A source region is formed beneath a trench in the substrate and below the top surface of the substrate, where the trench is positioned adjacent to the drain region. A floating gate is formed along a sidewall of the trench in the substrate. The semiconductor device has a channel region, between the drain region and the source region, and along the sidewall of the trench.

A method of fabricating the memory cell of the present invention may include the following steps. Parallel, alternating active regions and oxide regions are former in a substrate. A trench is created in the substrate transverse to the active regions and oxide regions. A gate oxide layer is formed on sidewalls and a bottom of the trench. A first polysilicon is formed on the gate oxide along the sidewalls of the trench. N-diffusion is implanted at the bottom of the trench and in the active regions.

Other objects, features, and advantages of the present invention will become apparent upon consideration of the following detailed description and the accompanying drawings, in which like reference designations represent like features throughout the figures.

DESCRIPTION OF THE PREFERRED EMBODIMENT

Figure 1:
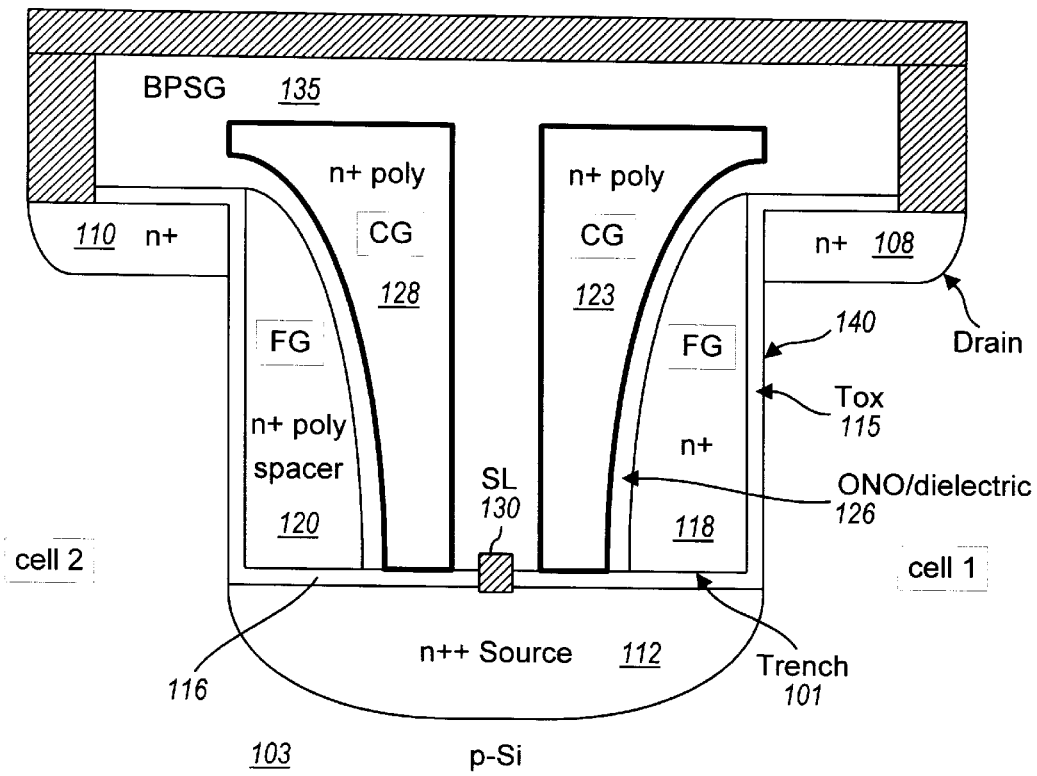
FIG. 1 is a cross-section showing two memory cells of the present invention.

FIG. 1 is a diagram of a cross-section of a basic nonvolatile memory cell of the present invention. Memory cells may be used in a multitude of applications including, but not limited to, storing information on an integrated circuit, storing configuration information for a programmable logic device, forming a programmable read-only memory, and forming a first-in, first-out memory. The memory cell of the present invention is nonvolatile, retaining its stored information for the lifetime of the memory cell, even when power is removed. The lifetime of a memory cell may be somewhat indefinite, but typically should be ten years or greater. The memory cell may be programmed and erased many times during its lifetime. Specifically, the memory cell is an electrically erasable programmable memory (EEPROM) cell or Flash memory cell.

In a preferred embodiment, two memory cells are formed in a trench 101 in a substrate 103. In FIG. 1, the trench is shown with sidewalls which are substantially vertical, or perpendicular to a top surface of the substrate. In other embodiments of the present invention, the trench may have angled walls such as a V-groove structure. In FIG. 1, a bottom of the trench is substantially flat. In other embodiments, the bottom may not be flat.

A first memory cell is formed on a first sidewall of trench 101, and a second memory cell is formed on a second sidewall. The first and second memory cells are symmetrical about a center of the trench. A drain region 108 and a drain region 110 are formed on a top surface of a substrate. The drain regions are positioned substantially adjacent to (or abutting) trench 101. Drain region 108 is a drain for the first memory cell in trench 101 while drain region 110 is for the second memory cell.

A source region 112 is formed beneath trench 101 in the substrate and below the top surface of the substrate. The drain regions and source regions are active regions of the memory cell. In alternative embodiments of the memory cell, the positions of the drain regions and source regions may be for example, reversed or flipped. The drain region may be used as a source and the source region may be used as a drain. For example, region 112 may be used as a drain and regions 108 and 110 may be sources. In FIG. 1, source region 112 is a shared source between the first and second memory cells.

A gate oxide layer extends throughout trench 101 and may also cover drain regions 108 and 110 from a top side. A gate oxide layer 115 covers the sidewalls of the trench while a gate oxide layer 116 covers the bottom of the trench. In an embodiment, the gate oxide layer (115 and 116) in the trench may be substantially uniform in thickness. However, in a preferred embodiment, gate oxide layer 116 at the bottom of trench 101 may be thinner than oxide layer 115 in other portions of the trench due to a different crystalline orientation.

Specifically, for example, the memory cell may be fabricated using a <1 0 0> silicon substrate. The surface of the substrate will have a <1 0 0> orientation. In an embodiment of the present invention where the sidewalls are substantially perpendicular to the surface of the substrate and the bottom of the trench, the silicon orientation along the sidewalls will be <1 1 1>. The bottom of trench 101 will have a <1 0 0> orientation since it is substantially parallel to the substrate surface. Silicon with a <1 1 1> crystal orientation is of higher density than <1 0 0> silicon. The resulting oxide grown on <1 1 1> silicon under the same conditions as <1 0 0> silicon will be thicker since there are more silicon atoms available for oxidation. In other words, oxide layer 116 grown on the <1 0 0> silicon at the bottom of trench 101 will be thinner than oxide layer 115 grown along the sidewalls. The oxide grown on the surface of the wafer, such as above drain regions 108 and 110, will be similar in thickness to that grown at the bottom of the wafer since the surface is <1 0 0> silicon.

The difference in thickness between oxide layer 115 and 116 may be typically less than about ten percent; in one embodiment, the thickness difference is in a range from about ten percent to about five percent. This thickness variation may result in improvements in performance. Oxide layer 116 at the bottom of the trench is where electrons tunnel through (e.g., to and from a floating gate) to program and erase the memory cell. Consequently, a thinner oxide at the bottom of the trench will improve the tunneling and programming characteristics of the memory cell. A further discussion of programming of the memory cell is given below.

In cases when the sidewalls are at an angle, not necessarily substantially perpendicular (e.g., about ninety degrees), then the oxide thickness will vary depending on the crystal orientation at different points on the sidewall resulting from the angle. For example, in a V-grove embodiment of the present invention, the oxide thickness will vary along the slope of the sidewalls. Also, the structure of the trench may contain for example, curved, sculptured, arched, rounded, or bowed wails (and combinations of these) to create structures where the oxide thickness is varied as desired. These may be used to improve the programmability characteristics (including programming, erase, and tunneling) of the memory cell.

Furthermore, oxide layers in locations where sidewalls of the trench meet the bottom of the trench (i.e., corners of the trench) or angled locations in the trench will be typically thinner than the surrounding areas. One reason, among others, is that in the angled locations, oxygen is less readily accessible because of the structure and geometry; the oxide growth is less which results in a thinner oxide. As described above, this is a feature of the present invention since programming of the memory cell can occur by tunneling of charge (e.g., electrons) through the angled location (e.g., corner) of the trench. This feature may be used in a technique of creating preferred locations in the memory cell where charge tunneling occurs.

If a silicon substrate with <1 1 1> orientation is used, compared to <1 0 0> silicon, an opposite effect occurs. The bottom of the trench and surface of the substrate are <1 1 1> silicon. The sidewalls are <1 0 0> silicon. Then, for similar reasons to those given above, the oxide layer grown on the sidewalls will be thinner than the oxide layer at the bottom of the trench. In certain embodiments, this feature may also be used to enhance particular attributes of memory cell operation. For example, this feature may be used in order to enhance the creation of preferred tunneling regions. In the angled locations or corners of the trench, the oxide would still remain thin due to the structure. With the thicker oxide at the bottom of the trench, this would increase the preference to tunnel charge through the corners of the trench.

There are situations when it would not be desirable to create preferential tunneling regions (such as those described at the angled locations in the trench). Various techniques may be used to increase the oxidation growth the corners. This may be accomplished by additional masking steps, increasing or reducing the ions implanted, or creating a somewhat curved structure or profile at the angled locations, and combinations of these, to name a few.

For the first memory cell, a floating gate 118 extends along the first sidewall from the top of the trench to the bottom of the trench. Gate oxide 115 is between floating gate 118 and the first sidewall. Gate oxide 116 is between floating gate 118 and the bottom of the trench. A floating gate 120 is similarly positioned on the second sidewall for the second memory cell.

For the first memory cell, a control gate 123 is positioned along the first sidewall of the trench and adjacent to floating gate 118. Control gate 123 covers floating gate 118. Between control gate 123 and floating gate 118 is an insulator layer 126 (or interpoly oxide). Insulator layer 126 may also be at the bottom of control gate 123, between control gate 123 and source region 112. A control gate 128 is similarly positioned on the second sidewall for the second memory cell.

A source line (SL) conductor 130 contacts the source region 112 at the center of trench 101. A drain line conductor contacts drain region 108 and may extend in a direction transverse to source line conductor 130. Another drain line conductor may similar contact drain region 110. For example, in FIG. 1, a conductor 133 contacts drain regions 108 and 110; this conductor may be fabricated using metal or other conductive material. Conductor 133 may be used as drain line for a row of memory cells. In other embodiments of the present invention, separate conductors may be used for individual memory cells. A passivation layer 135 seals the entire memory cell.

The memory cell of the present invention is extremely compact. As described above, a channel region 140 is substantially transverse to a surface of a substrate. In particular, the flow of electrons from drain region 108 to source region 112 will be parallel to a sidewall of trench 101. Therefore, the lateral dimensions of the memory cell are not limited by the processing techniques and the ability to achieve shorter transistor channel lengths. Larger numbers of memory cells can be fabricated into a smaller silicon area.

The memory cell of the present invention may be fabricated using many different process technologies using many different materials. In a preferred embodiment, a p-type silicon substrate is used. As described earlier, the crystalline structure may be <1 0 0>. Drain regions 108 and 110 are n+ diffusion. Source region 112 is n++ diffusion. Hence, the memory cell is an NMOS device. Floating gates 118 and 120 are n+-doped polysilicon spacers. Control gates 123 and 128 are n+-doped polysilicon. Insulator layer 126 is an oxide-nitride-oxide (ONO) layered dielectric stack. Passivation layer 135 is boron phosphor-silicate glass (BPSG). Depending on the processing technology used, the dimensions and physical parameters of the memory cell will vary. In a specific embodiment, for purposes of example, the trench width is approximately 1.6 microns. The trench depth depends in part on the channel length and is in range from about 0.65 to 0.90 microns. The n+ junction width of drain regions 108 and 110 is about 0.7 microns, while the junction depth is about 0.2 microns. The thickness of gate oxide 115 is about 90 Å. The thickness of gate oxide 116 may be less than about 90 Å (e.g., 80 Å). The thickness of insulator layer 126 is about 225 Å.

In operation, the memory cell of the present invention operates similarly to an electrically erasable programmable memory (or EEPROM or Flash) cell. Typical EEPROM devices are lateral devices where current flow is in a lateral direction. In the memory cell of the present invention, however, the current flow, is along a trench sidewall. Specifically, in the present invention, channel region 140 forms in the substrate, between the drain region and the source region, and along a sidewall of the trench. Generally, in relation to a surface of the substrate which is horizontal, the current flow is in an angled direction, depending on the type of trench used. For example, if the trench sidewalls are at a forty-five degrees angle, then current flow will be forty-five degrees from horizontal. The trench sidewalls may be at various angles including, to name a few, thirty degrees, sixty degrees, seventy degrees, seventy-five degrees, eighty degrees, eight-five degrees, ninety degrees. Negative angles may also be possible if allowed by the processing. In a preferred embodiment, it is desirable that the sidewalls are close to ninety degrees, subject to processing technology constraints, because this tends to minimize the amount of lateral area used. Therefore, electrons traveling between the drain and source regions may flow in a direction substantially transverse to the surface of the substrate. In a preferred embodiment, the memory cell of the present invention is a vertical NMOS device.

Moreover, in a preferred embodiment, there are two EEPROM or Flash memory cells in the memory structure of the present invention. In FIG. 1, the memory cells are mirror images of another on opposite sidewalls of the trench. In another embodiment of the present invention, the memory cells may be on opposite sidewalls of the trench, in a staggered arrangement, not direct across from another. Although sharing a source region, the two memory cells operate independently of each other. For example, each memory cell may be programmed or erased independently of the other. By packing in two memory cells, the memory cell structure of the present invention reduces the silicon area per memory bit. Accordingly, memories with greater densities may be fabricated. For example, when using the memory cell of the present invention, a Flash memory integrated circuit may hold twice or four times or greater the data previously possible. In a programmable logic device, the memory cell of the present invention may lead to greater numbers of logic elements and programmable interconnect which permit the implementation of larger and more complex logical functions.

The memory cell stores and outputs a logic low or logic high. The memory cell has two states: programmed and erased (not programmed). Depending on the memory technology used, the terms "programmed" and "erased" may have different meanings. In this specification, the IEEE convention for these terms is used. Specifically, "programmed" reefers to placing a memory cell into an "off" or nonconducting state, and "erased" refers to placing a memory element into an "on" or conducting state.

Data is stored in the memory cell by programming or erasing the memory cell. There are many different techniques for reading data from the memory cell. For example, Rome commonly used techniques include using a sense amplifier, coupled to a drain of the memory cell, to sense the cell's state. A pull-up device such as a resistor, or other passive or active component, may be coupled to the drain to determine the stored state. More specifically, when using a resistor pull-up and the memory cell is erased, the memory cell is conducting and the drain node of the memory cell will be pulled low. This low level indicates the memory cell is erased. Note that the current flow between the drain and the source is along the sidewalls of the trench, in a transverse direction. On the other hand, when the memory cell is programmed, the memory cell is not conducting and the drain node of the memory cell will be pulled high. This high level indicates the memory cell is programmed. The memory cell of the present invention may be used to provide approximately full-rail voltage output at the drain node. Also, the stored state of the memory cell may be determined using techniques which require very low or zero power consumption.

The memory cell of the present invention has a floating gate to provide for nonvolatility and reprogrammability. To program and erase the cell, high voltages may be used to transfer charge to and remove charge from the floating gate through the gate oxide by various physical mechanisms such as avalanche injection, channel injection, quantum-mechanical tunneling, hot electrons, and other phenomena.

A high voltage (VPP) used to program the memory cells may be somewhat different from a high voltage (VEE) used to erase the memory cells. The magnitude of VPP and VEE depends on the physical characteristics of the memory cell including such considerations as the thickness and composition of the dielectric between the substrate and the floating gate.

Typically, VPP and VEE voltages are in the range of approximately 12 volts to 14 volts. However, as process technology continues to improve, it will become possible to fabricate thinner and better gate oxide dielectrics. Consequently, the high voltages needed to program and erase the memory cells may decrease in magnitude.

To erase the memory cell, charge is electrically removed from the floating gate using high voltages and quantum-mechanical tunneling. After erasure, EEPROM and Flash EEPROM memory cells may be reprogrammed. Flash EEPROM memory cells are generally programmed using hot electrons, while EEPROM cells are programmed using quantum-mechanical tunneling. In some cases, Flash EEPROM memory cells are programmed using quantum-mechanical tunneling. EEPROM and Flash memory cells may be programmed, erased, and reprogrammed many times.

When an EEPROM and Flash EEPROM memory cells is programmed, charge is placed on a floating gate and in so doing, that memory cell is placed in a high threshold voltage state (VTP or high VT). The floating gate holds this charge indefinitely, even when power is not supplied to the memory cell; this provides nonvolatility. In the programmed or high VT state, a reasonable voltage on a control gate of the memory cell will not turn the memory cell on. In this case, a reasonable voltage is a voltage between the supplies of the integrated circuit, VDD and VSS. Furthermore, in the case when a voltage above VTP is placed on the control gate, the memory cell may turn on. For EEPROM and Flash EEPROM memory cells, the typical threshold voltage for a memory cell in a high VT state is, for example, approximately 6 volts. Moreover, when programmed using an "assist" technique (described below), the high VT state for EEPROM memory cells may be somewhat higher then 6 volts.

When erased, charge is removed from the floating gate and the memory cell is placed in a low VT state VTE).

The floating gate retains this erased state for the life of the memory cell, even when power is not supplied to the memory cell. In the erased or low VT state, a reasonable voltage on a gate of the memory cell will turn the memory cell on. For EEPROM and Flash EEPROM memory cells, the typical threshold voltage for a memory cell in a low VT state ranges from approximately 0.5 volts to 1.5 volts. When EEPROM or Flash EEPROM cells are erased using a "smart" algorithm, a specific low VT voltage level state may be achieved. For example, the VTE may be about −1 volts. In another example, the VTE may be zero volts or slightly above zero volts. A smart algorithm removes charges from the floating gate using an iterative technique, removing small amounts of charge until a desired VTE is achieved. A smart algorithm may be used to prevent a negative VTE, especially important in some applications where a negative VTE is undesirable such as for high-density, high-capacity Flash EEPROM memories. In other applications such as programmable logic devices, a negative low VT state may be allowable because, among other reasons, the memory cell may be accessed using a read transistor in series with the memory cell.

When an array of EEPROM or Flash EEPROM memory cells is "initialized," the cells are erased to a low VT state. Flash EEPROM memory cells are initialized when bulk erased. However, when an array of EEPROM memory cells is initialized, the cells typically may be programmed to a high VT state. The initiation state of a memory array is chosen based on many considerations including the process technology selected to fabricate of the memory cell devices themselves and the intended use for the memory cells, and the connections in the cell array.

The control gate activates the memory cell. During normal operation, the control gate is coupled to a voltage level which activates and enables operation of memory cell. Until activated, the memory cell is in a nonconducting state. To activate the memory cell, the control gate is coupled to a voltage level which is greater than VTE and less than the VTP. For example, for a typical EEPROM cell, a control gate voltage should be above about 1 volts (VTE) and less than about 5 volts (VTP). The control gate may be coupled to a switching signal line, which provides voltages between VSS and VDD. In a preferred embodiment of the present invention, to provide the greatest amount of programming and erase margin, the control gate voltage is selected to be at approximately the center of VTE and VTP. For example, for a typical EEPROM memory cell, the control gate voltage is set in the range from about 1.7 volts to about 2 volts. As a further example, for an EPROM memory cell, where VTE equals about 1 volt and VTP equals about 7 volts, the control gate voltage may be VDD, or a higher voltage level. An activation voltage above VDD may be used because among other reasons, this may be required by the memory element, or a higher voltage level is readily available. The control gate is also used during the programming of the memory cell, which is described in more detail below.

Figure 2:
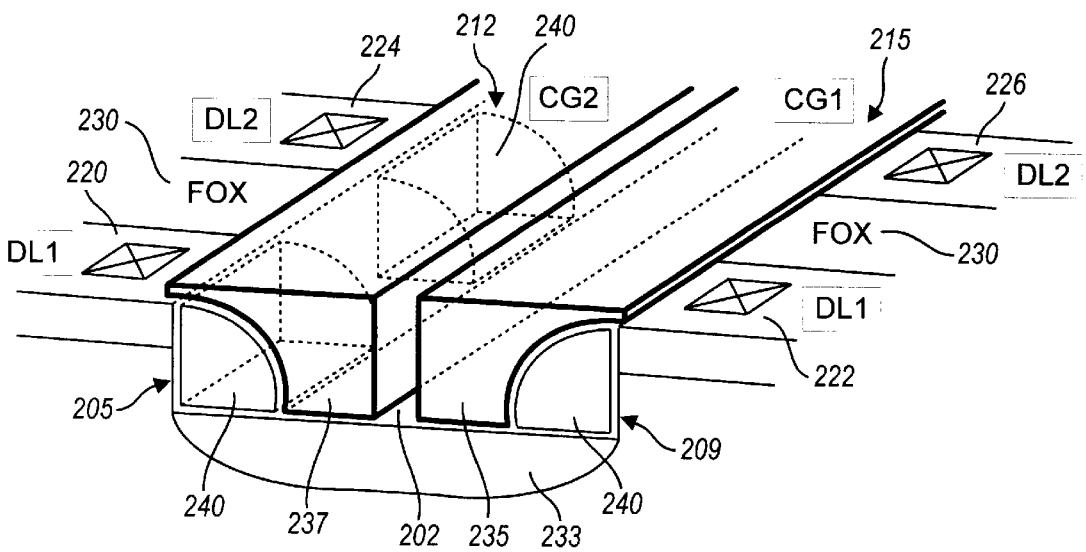
FIG. 2 is a side perspective view of the memory cell of the present invention.

FIG. 2 is a side perspective view of the memory cell of the present invention. This view shows how a plurality of memory cells may be fabricated in a trench 202. In this configuration, there are four memory cells 205, 209, 212, and 215. Additional memory cells may be added in a similar manner. For example, trench 202 may be lengthened to accommodate as many memory cells as desired. In a typical integrated circuit, a trench may accommodate hundreds, or even thousands, of memory cells. Moreover, there may be a plurality of trenches 202 on an integrated circuit to create an array of memory cells.

As discussed above, each of the memory cells has a drain, source, floating gate, and control gate. Memory cell 205 has a drain region 220, memory cell 209 has a drain region 222, memory cell 212 has a drain region 224, and memory cell 215 has a drain region 226. Each drain region has a contact which couples to a conductor for coupling the drain to other portions of the circuitry. A field oxide region 230 separates drain regions 220 and 224, and also separates drain regions 222 and 226. In a preferred embodiment, drain regions 220 and 222 may be coupled together using a conductor, to form a drain line for the memory cells. Similarly, drain regions 224 and 226 may also be coupled together to form another drain line for the memory cells. Field oxide region 230 effectively separates memory cells 220 and 224, and memory cells 322 and 226. In a preferred embodiment, a source region 233 is commonly shared by the memory cells in trench 202. Further, a first control gate 235 is shared by memory cells formed on a first sidewall of the trench. And, a second control gate 237 is shared by memory cells formed on a second sidewall of the trench. In a preferred embodiment, each memory cell has individual floating gates 240, as shown.

Figure 3:
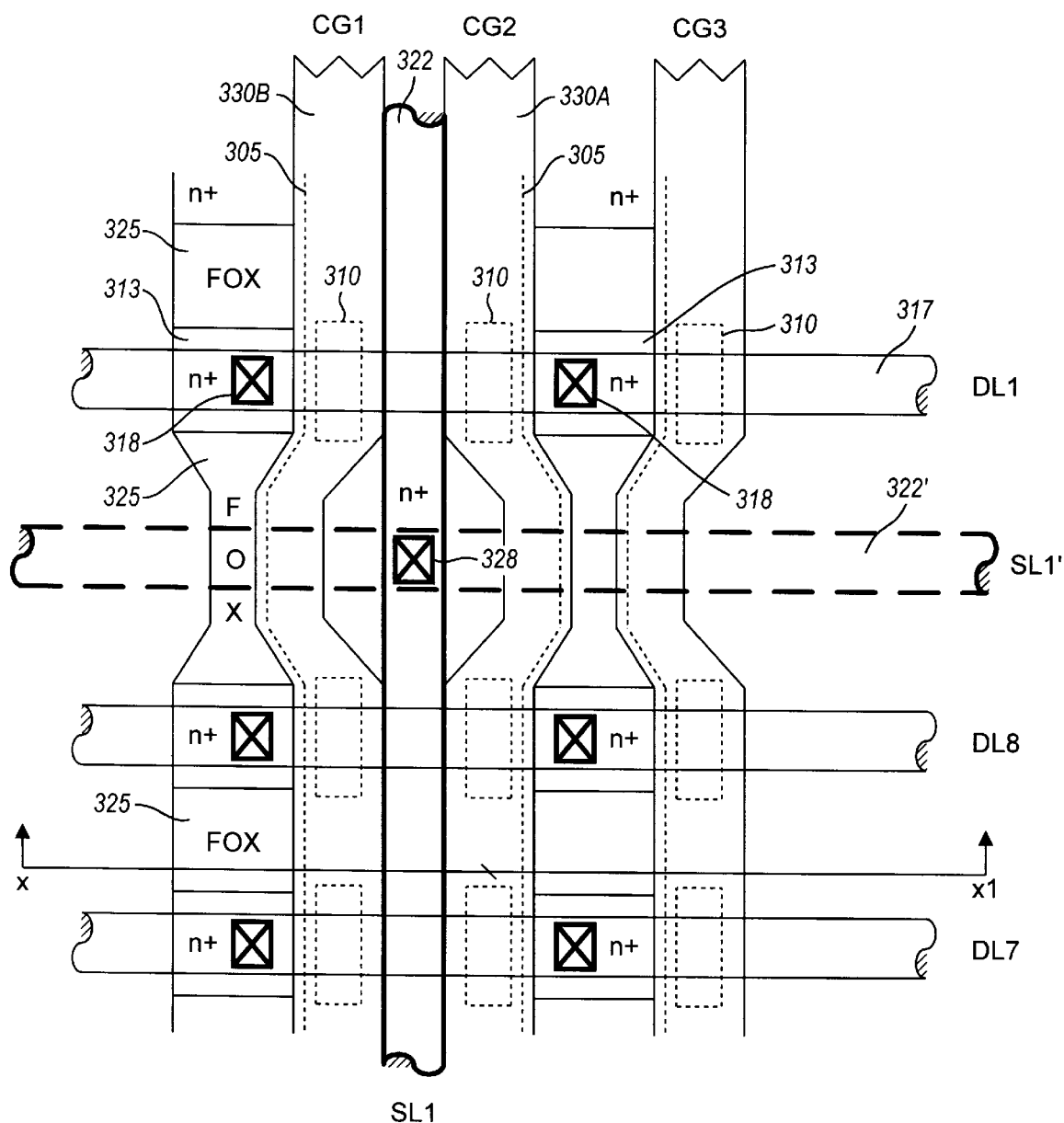
FIG. 3 is a layout of the memory cell of the present invention.

FIG. 3 is a layout of the memory cell of the present invention. A trench is shown outlined by dashed lines 305. Each memory cell has a floating gate 310 and a drain Legion 313. For a row of memory cells, drain regions 313 are coupled together via a drain line conductor 317 (by way of a contact 318) for connecting to other circuitry on the integrated circuit. Each row of memory cells has an individual drain line conductor. The drain regions of the memory cells are separated by oxide. As described earlier, the memory cells in a column share a common source, also indicated by dashed lines 305. In order to reduce source line resistance, the source region may be strapped at various locations (e.g., every eight memory cell bits) using a source line conductor 322 along the column. In the alternative, the source region may be periodically strapped perpendicular to the column using a source line conductor 322' as shown. For example, the source region may be coupled to a metal conductor using a contact 328. There are two control gates, 330A and 330B, which run along the trench for a column of memory cells. A first control gate 330A is for memory cells along a first sidewall of the trench, while a second control, gate 330B is for memory cells along a second sidewall of the trench. In order to reduce resistance and capacitance delay effects, the control gates may be strapped at periodic intervals; the control gates may be strapped by metal, for example. In an alternative embodiment, the control gates may be fabricated using polysilicide, and strapping may not be required due to the relatively low resistance of polysilicide.

FIG. 3 shows the symmetry and compactness of the layout of the memory cells of the present invention. For example, drain regions 313 are shared between memory cells in adjacent columns. The source region is shared by the memory cells in a column. Each column of memory cells exhibits symmetry about a centerline running the length of trench. The layout of the present invention is an extremely compact means for constructing an array of memory cells.

Figure 4:
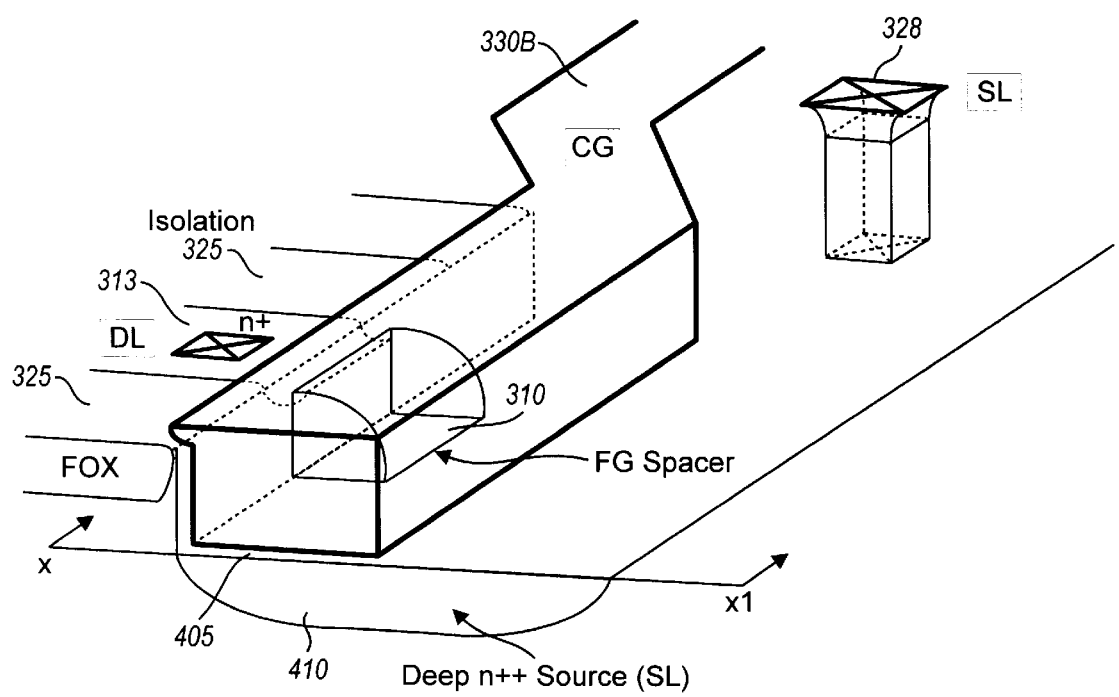
FIG. 4 is a partial perspective view of a layout of a single memory cell bit.

FIG. 4 shows a partial perspective view in the x-x1 direction of the layout in FIG. 3. For clarity, only a single memory cell is shown. The memory cell is fabricated in a trench 405, and more specifically, along a sidewall of trench 405. The memory cell has a drain region 313, floating gate 310, and control gate 330B. The memory cell has a source region 410 below trench 405. Source region 410 may be periodically strapped to another conductor using contact 328. Isolation or field oxide regions 325 separate the memory from other memory cells.

Figure 5:
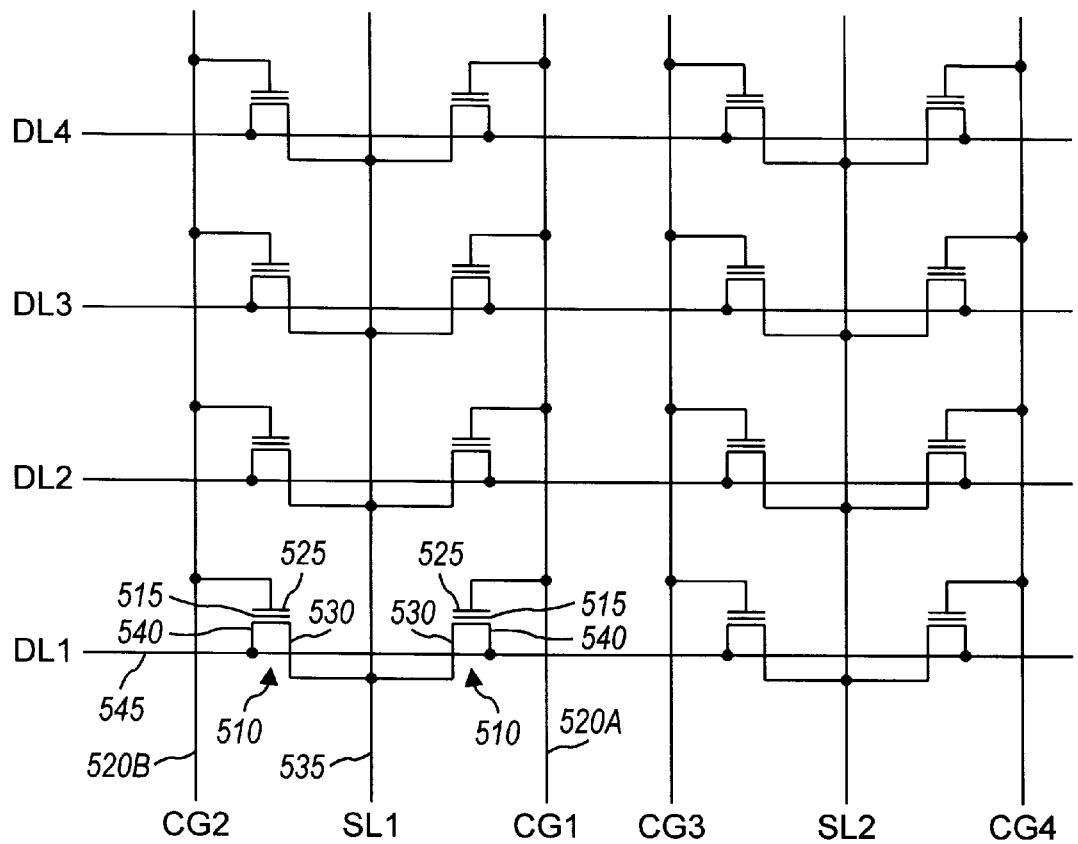
FIG. 5 is a schematic for an array of memory cells.

FIG. 5 shows a circuit schematic of the memory cell of the present invention. The schematic is arranged and drawn to correspond to the layout shown in FIG. 3. The electrical connections of the devices are clearly shown. There is an array of memory cells 510, arranged in multiple rows and columns. In this schematic, there are four rows of memory cells. And, there are four columns of memory cells, where a pair of columns share a common source region. The memory cells have floating gates 515. In a first column, a first plurality of memory cells 510 have control gates 525 coupled to a first control gate line 520A. In a second column, a second plurality of memory cells 510 have control gates 510 coupled to a second control gate line 520B. The first plurality of memory cells correspond to memory cells along a first sidewall of the trench, while the second plurality of memory cells are along a second sidewall. As in the layout, two columns of memory cells 510 have source regions 530 coupled a common source line 535. For a row of memory cells, drain regions 540 are coupled to a common drain line 545.

The layout shown in FIGS. 3–4 and schematic shown in FIG. 5 are for a NOR-type memory configuration. However, the memory cell of the present invention may be used in many different configurations and architectures as discussed earlier. For example, the memory cell of the present invention may be used in NAND-type memories, PLDs, ASICs, mixed analog-digital devices, and microprocessors, to name a few.

Programming of the memory cell of present invention will be discussed in conjunction with the memory array configuration shown in FIG. 5. Quantum-mechanical tunneling is the mechanism used to erase the memory cell. In a preferred embodiment, an array of Flash memory cells of the present invention are initialized by bulk erasing the array. However, as discussed earlier, the initialized state may be arbitrarily chosen depending on the particular application and technology used. To erase the memory cells, source lines 535 for the array are placed at VEE. Control gate 520 and drain lines 545 are grounded. Then, referring to FIG. 1, electrons from floating gate 118 (and 120) are attracted through the gate oxide 116 into source region 112. Because of the structure of the memory cell of the present invention (refer to FIG. 1), electrons are transferred from the floating gate through the thin gate oxide 116 at the bottom of trench 101. As discussed earlier, this oxide may be thinner than oxide at other portions of the trench due to the silicon crystalline orientation. In an further embodiment, the oxide may be thinner at angled locations (e.g., corners) of the trench, and electrons will preferentially tunnel through at these locations.

This removes electrons from the floating gate, and the floating gate becomes more positively charged. Thus, the memory cell is erased to a low VT state. The entire array may be erased in one operation. Alternatively, the array may be selectively erased. For example, individual rows of the array may be erased on a row-by-row or column-by-column basis until the-desired portions of the array are erased. The user may wish to imprint the array with a pattern for testing purposes. Or, the user may desire to erase only portions or blocks of the array, which may be useful for applications such as Flash disks or Flash ROMs.

Whether an array may be selectively or "bulk" erased may depend on the construction of the array, and more specifically, the source line. If a common source line is used, then those memory cells coupled to the same source line may be erased in the same operation. Therefore, if the entire array is coupled to the same source line, the entire array may be erased in one operation. However, portions of the cells may be coupled to different source lines to permit more flexible erasing of portions of memory cells; there may be some added complexity when providing a selective erase. For example, the programming circuitry may be more complex. Also, the cell layout may be less compact due to more source lines.

When erasing the memory cells 530, a negative assist programming technique may be used by placing a negative assist voltage on control gate lines. For example, a voltage of −3 volts may be placed on control gate line 520A. This enhances the transfer of electrons from floating gate 118 (and 120) to the source region 112 (see FIG. 1). This would decrease VTE, improving the erase margin of the memory cell. This would also reduce the level of VEE required to erase.

Memory cells 510 in FIG. 5 may be selectively programmed to imprint a desired pattern into the array. To program a particular memory cell 510, its control gate 525 is set to VPP. The source line 535 corresponding to the source region 530 of the selected memory cell is grounded. A drain line 545 for the selected memory cell is set to a VPD voltage. The drain lines for memory cells to remain erased are grounded. VPD is selected to optimize the efficient programming of the memory cells 510 of the present invention. The considerations for VPD include ensuring that the memory cells are programmed well, minimizing any destructive effects on the cell, and observing the current density constraints of the power conductors. In a preferred embodiment, VPD is in the range from about 6 to 7 volts.

Under these conditions, a significant current flows from the drain of the memory cell transistor through to the source. For example, this current may be about five hundred microamps. Referring to FIG. 1, note that this current flow is along the sidewall of trench 101, which is in an arched or transverse direction. This current generates hot electrons, some of which jump a dielectric barrier (gate oxide 115) and become trapped in floating gate 118 (or 120) of the memory cell. Note that the hot electrons jump the dielectric barrier along the sidewall of the trench. The floating gate becomes more negatively charged due to the additional electrons. The selected memory cell is programmed to a high VT state (VTP). VTP is typically about 6 volts.

The memory cells are selected for programming using the grid system described above, where the appropriate voltages are placed on the appropriate drain lines and source lines. Programming proceeds in a row-by-row or column-by-column fashion until the desired pattern is imprinted into the array. This also minimizes the programming current drain, since only a portion of the memory cells are programmed at the same time. For example, when the programming currents are sufficiently large, programming may be limited to eight to sixteen bits or cells at a time.

Figure 6:
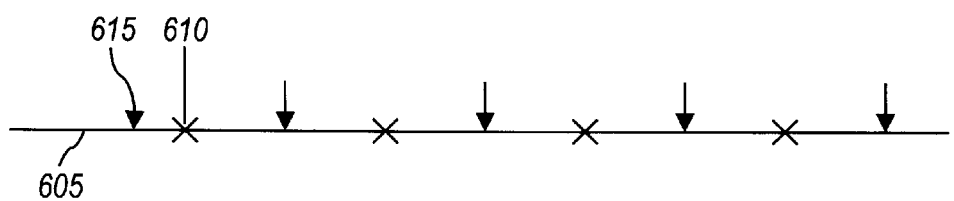
FIG. 6 illustrates a distributed programming scheme of the present invention.

The programming current drain may be distributed more evenly among the memory cells by using a distributed programming technique. For example, during programming, the memory cells to be programmed may be selected so that these cells are evenly distributed in the array. This minimizes any current density concerns that may arise because too much current flows through particular conductors. A simple technique of distributed programming is illustrated in FIG. 6. FIG. 6 show a row of memory cells 605 where the source lines are periodically strapped at locations 610. More specifically, at locations 610, the memory cells 605 have very good connections to ground (usually by way of a metal conductor). When selecting cells to program, for example, the cells are selected at locations indicated by arrows 615. This ensures that the current flow from the memory cells during programming will not overload particular strapped locations 610, as would occur if all the memory cells were selected between the same two strapped locations 610. In the example shown in FIG. 6, the current flow will be equally distributed among all the strapped locations 610. FIG. 6 is an illustration of a particular distributed programming technique. It will be appreciated that many other patterns may be used to distribute current flow more equally among the strapped locations 610. For example, two cells may be programmed between each strap.

In an alternative embodiment of the present invention, the memory cells of the present invention may also be programmed using quantum-mechanical tunneling. Using quantum-mechanical tunneling, substantially less current is needed to program the memory cells than using hot electrons. Typically, EEPROM cells are programmed using quantum-mechanical tunneling while Flash EEPROM cells are programmed using hot electrons, although this is not always necessarily the case. Using quantum-mechanical tunneling, the memory cells are programmed primarily due to the magnitude of the high voltages across very thin dielectrics (typically seventy to ninety angstroms of gate oxide). Therefore, since high currents are not necessary, the use of quantum-mechanical tunneling generally provides integrated circuits which may be configured while resident on a system board—sometimes referred to as in-system programming (ISP)—where large currents are often unavailable.

To program a selected memory cell using quantum-mechanical (e.g., Fowler-Nordheim) tunneling, the drain line 545 and source line 535 corresponding to drain 540 and source 530 of the selected memory cell are grounded. The control gate 525, via the appropriate control gate line, is set at VPP. Under these conditions, electrons will tunnel from the source region 112 (refer to FIG. 1) through the gate oxide 116 into floating gate 118 of the memory cell. Note that the electrons pass through the gate oxide dielectric at the bottom of the trench. Floating gate 118 becomes negatively charged so that the memory cell is programmed to the high VT state.

This technique may be repeated to program the desired memory cells.

As discussed earlier, a memory array of the present invention may be initialized to an bulk programmed state instead of a bulk erased state, if desired. To bulk program, the above technique for programming individual cells may be repeated row-by-row or column-by-column until all cells are programmed. Another technique is to coupled control gate 525 to VDD. Source region 530 and drain 540 may float. Then, the substrate or bulk is pumped to a negative voltage, typically in the range, for example, from −10 V to −15 V. This causes electrons to be transferred into floating gate 515 for the memory cells on the integrated circuit. The memory cells will be programmed to a high VT state, or bulk programmed. This bulk program technique will be typically faster than iterative programming by rows or columns.

The floating gate retains the programmed or erased state of the memory cell indefinitely. Data retention for the memory cell for present invention is on the order of ten years or more. Therefore, the data retention of the memory cell is sufficiently long that the data need not be periodically refreshed like a dynamic memory. This is especially useful for many applications where a programmable ROM-like storage is required.

Figure 7:
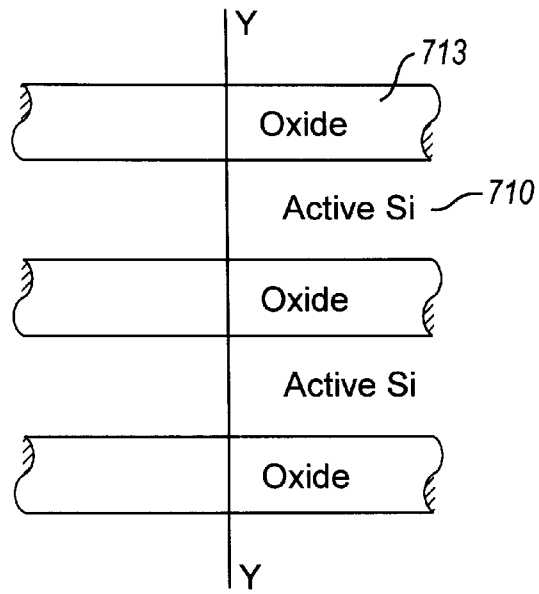
FIG. 7 illustrates a substrate having oxide and active regions.

FIGS. 7–17 show some of the results from the processing steps that may be used in fabricating the memory cell of the present invention. A technique of the present invention for fabricating a memory cell may include the following steps. In a preferred embodiment, the memory cell is fabricated on a substrate. Some examples of substrates include semiconductor wafers, silicon wafers, semiconductor-on-sapphire wafers, and many other similar material. On the substrate, parallel and alternating active regions 710 and oxide regions 713 are formed, as shown in FIG. 7. In other words, stripes or strips of oxide 713 are formed on the substrate leaving active regions 710 between the stripes. The oxide regions will serve as isolation regions between the memory cells. The resulting widths of oxide regions 713 may be equivalent or not equivalent to widths of active regions 710. However, in order to obtain a maximum memory cell packing density, a minimum width for oxide regions 713 should be used which provides adequate isolation. Further, a minimum width for active regions 710 should be used which provides acceptable, reliable memory cell characteristics (e.g., read current, data retention) and connectivity (e.g., for minimum contact size).

Figure 8:
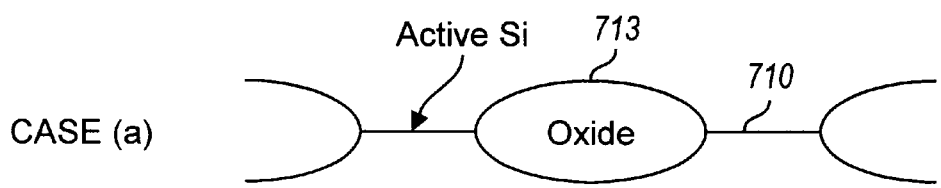
FIG. 8 is a cross-section showing the result after a LOCOS processing step.
Figure 9:
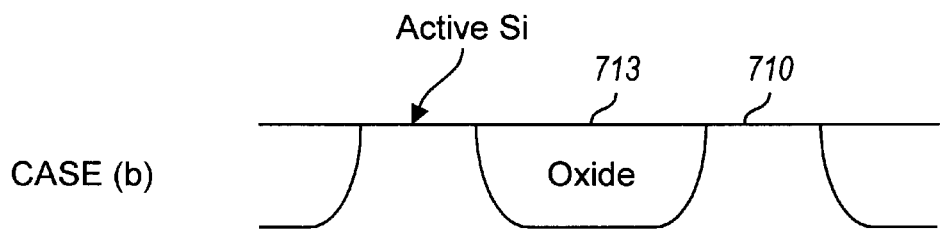
FIG. 9 is a cross-section showing the result after a trench fill isolation step.

The isolation regions may be formed using many different processing techniques. For example, LOCOS, recessed LOCOS, or poly buffer LOCOS, separately, or in combination, may be used to create the oxide regions. A cross-section of the result from using this technique is shown in FIG. 8. A trench-fill isolation may also be used to create the isolation regions. A cross-section of the result from using the trench-fill isolation technique is shown in FIG. 9. Compared to the LOCOS technique shown in FIG. 8, the trench-fill isolation technique results in a more planar surface, which may be desirable for certain processes because this enhances the printing of small geometries and clear etching of material. A more planar surface may also minimize the steps which may cause coverage problems and fractures (e.g., metal cracks). The isolation regions formed by the LOCOS technique may be planarized, if desired, to obtain a flatter substrate surface.

Figure 10:
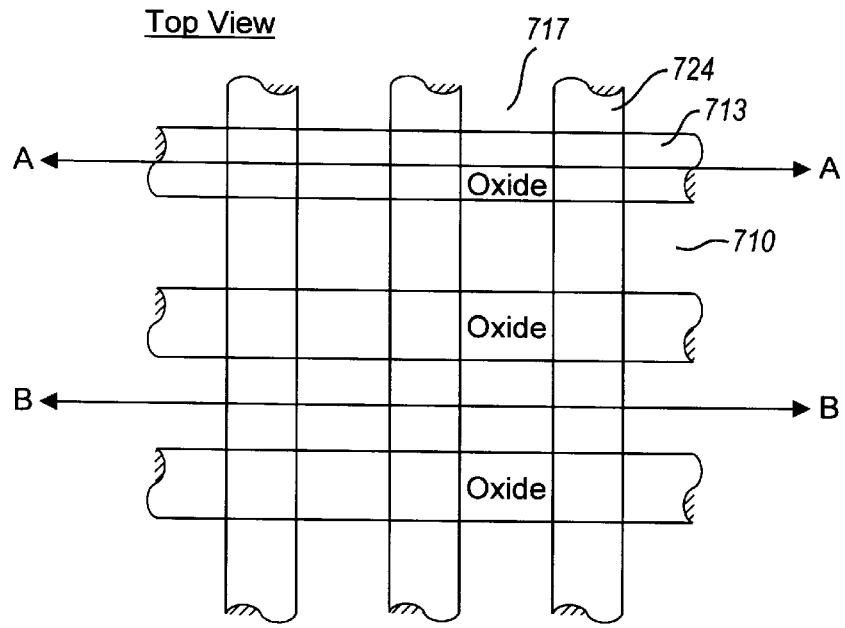
FIG. 10 illustrates the formation of a trench in the substrate.
Figure 11:
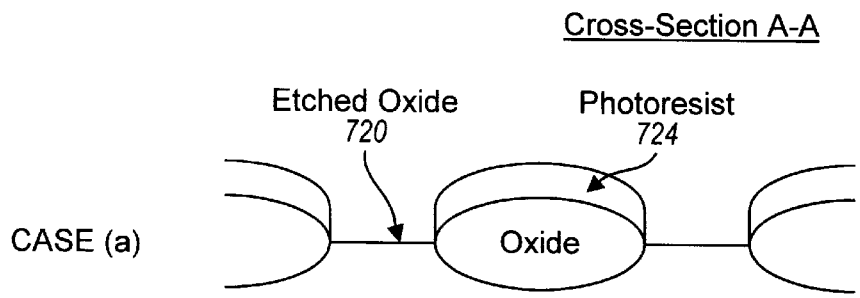
FIG. 11 is a cross-section showing the result after an etching step along the oxide region.
Figure 12:
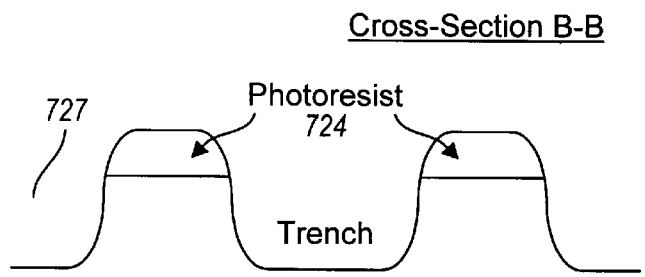
FIG. 12 is a cross-section showing the trench resulting after an etching step along the active region.
Figure 13:
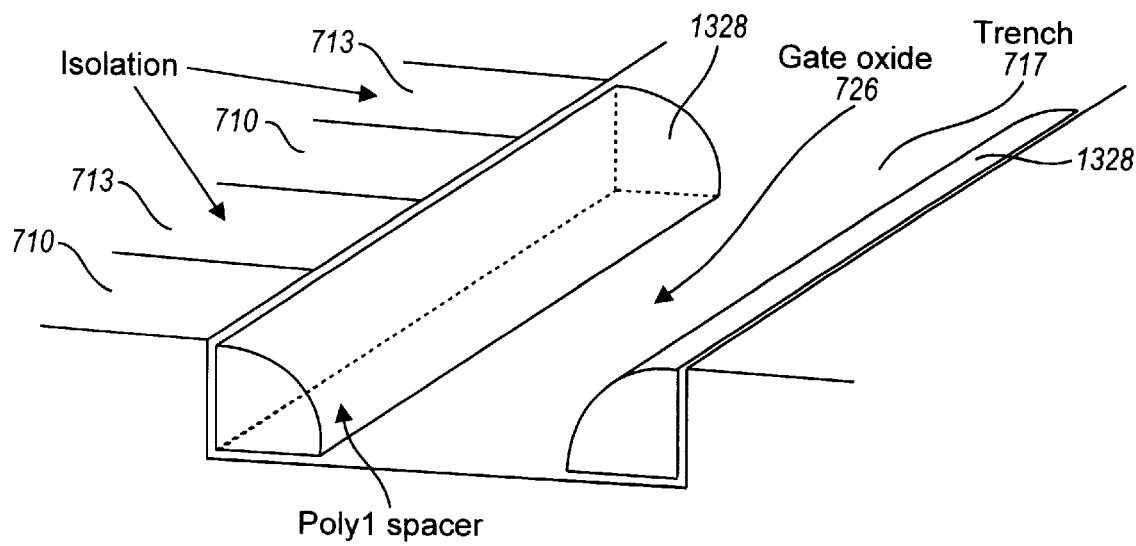
FIG. 13 is a cross-section showing the result after formation of a floating gate using a polysilicon spacer technique.

As shown in FIG. 10, a trench 717 is formed in the substrate. To create on an array of memory cells, a plurality of trenches 717 are created the substrate. Trenches 717 are transverse to active regions 710 and oxide regions 713. Trenches 717 are substantially parallel to another. To form trenches 717, a photoresist and photolithography masking step may be used to define the trench regions. Specifically, photoresist is applied to the substrate or wafer. A trench mask is used to expose the photoresist to be removed, which will define trench regions 717. The photoresist in the exposes regions is removed. Subsequently, an etch step is used to remove a portion of trench 717 in silicon active regions 710. An etch step is used to remove a portion of trench 717 in oxide regions 713. Alternatively, an anisotropic etch may be used to etch active 710 and oxide 713 regions at the same time. A resulting cross-section along oxide regions 713 (i.e., cross-section A—A) is shown in FIG. 11. FIG. 11 shows that oxide 720 has been removed in trench regions 717. The regions where photoresist 724 remains are not etched. FIG. 12 shows a resulting cross-section along active regions 710 (i.e., cross-section B—B). A trench 727 is etched in the active regions where photoresist 724 has been removed. The result of forming a trench 717 in the substrate having alternating active 710 and oxide 713 regions is shown in FIG. 13. Oxide regions 713 serve as isolation regions that separate memory cells which will be formed in trench 717 in active regions 710.

A thin gate oxide 726 (also see gate oxide 115 and 116 in FIG. 1) is grown. This gate oxide will be the thin oxide between the floating gate and channel of the memory cells. In a specific embodiment, this gate oxide may be fairly uniform in thickness over the substrate, in the trench on the alternating active and oxide regions. However, as discussed above, this oxide may vary in thickness depending of the crystalline structure. For example, in one embodiment, the oxide at the bottom of the trench will be thinner than the oxide formed on the sidewalls.

A threshold adjust implant may be used to adjust the voltage threshold of the vertical or transverse channel of the memory cell. A tilt angle and rotation technique may be used. This technique involves implanting the vertical channel of the present invention at a tilt angle. For example, the substrate is "tilted" or angled relative to the implant source. Since in a preferred embodiment there are memory cells on two sidewalls, the substrate or wafer may be rotated to implant the channel on the other sidewall also using a tilt angle. The rotation angle should be 180 degrees.

A first polysilicon is deposited on the substrate on the gate oxide. This first polysilicon will become the floating gate (see floating gate 118 and 120 in FIG. 1) for the memory cell. An (anisotropic) polysilicon spacer etch is used to define the floating gate regions. The result after the poly spacer etch is shown in FIG. 13, where polysilicon regions 1328 adjacent the two sidewalls of the trench will become the floating gates of the memory cells. FIG. 1 also shows the resulting cross-sections of floating gate 118 (and 120) from the spacer etch.

Figure 14:
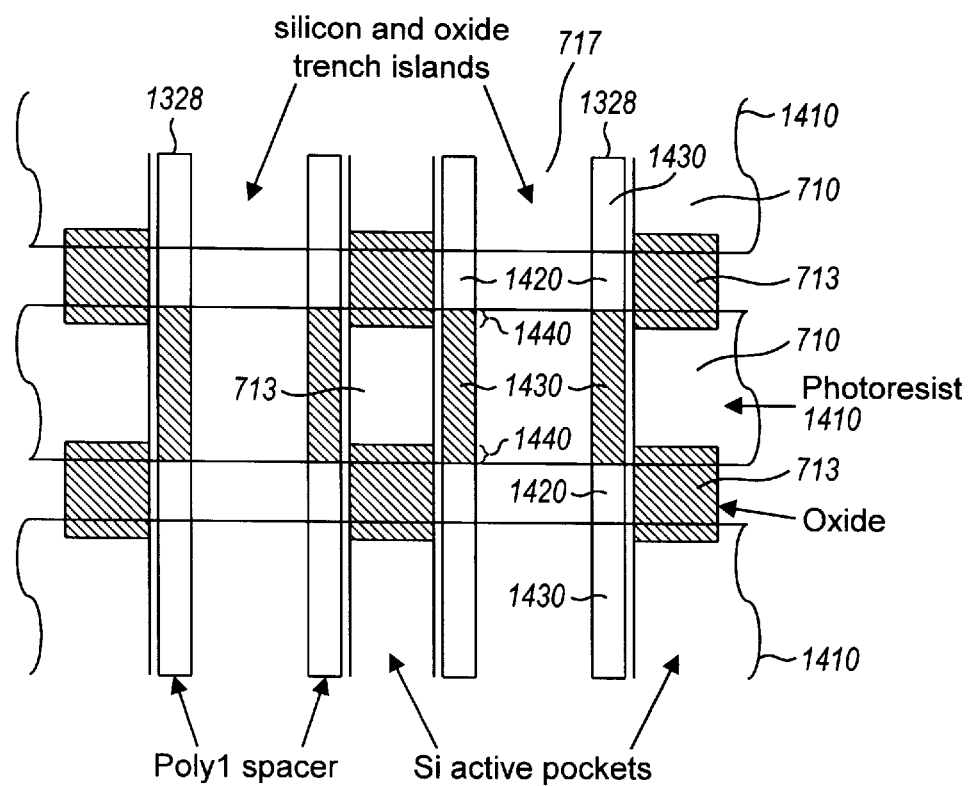
FIG. 14 shows a top view of the substrate where portions of the polysilicon runner are removed to create individual memory cells.

A memory cell needs an individual floating gate for storing charge representative of its stored state. This floating gate cannot be commonly connected with the other memory cells in a trench. Therefore, the first polysilicon "strips" in the trench need to be separated in order form individual, neighboring floating gate for the memory cells. FIG. 14 shows a top view of the substrate. Photoresist and masking steps are used to define portions 1420 of polysilicon strips 1328 which will be removed by etching. Photoresist 1410 defines areas 1430 that will not be etched. Polysilicon portions 1420 are removed and floating gate regions 1430 remain isolated from the floating gate regions 1430 of other memory cells. Floating gates 1430 will be used for the individual memory cells. Note that in general, polysilicon 1420 is removed from sidewalls adjacent to isolation (or oxide) regions 713. In other words, polysilicon 1430 remains for sidewalls adjacent to active region 710. Additionally, polysilicon endcaps 1440 may extend along sidewalls adjacent isolation regions 713 to provide tolerances for processing or other effects.

An implant is used to form a source region 112 (see FIG. 1) beneath trench 101. N+- or n++-type diffusion is used to form source region 112. The n+ diffusion may be deposited beneath trench 101 using a variety of techniques including, but not limited to, ion implantation and vertical diffusion. Similarly, an implant is used to form drain regions 108 (see FIG. 1). Typically, an n+-type implant is used to form drain regions 108. Drain regions 108 are formed in active region 713, between, adjacent, or in proximity to isolation regions 713. For example, referring to FIG. 14, active regions 713, outside trench 717, would be implanted to become drain regions 108. Moreover, source and drain regions may be implanted in a single step by depositing n-type diffusion in active region 713, inside and outside trench 717. Additional implants may be used to enhance the characteristics of the source or drain regions, or both, by individually implanting the source or drain regions, or both.

An interpoly layer 126 (see FIG. 1) is grown over the substrate, in the trench, on the polysilicon spacers (i.e., floating gates). This interpoly layer 126 is typically a thick oxide (i.e., compared to thin gate oxide 115 and 116) dielectric. As discussed earlier, in a preferred embodiment, interpoly oxide 126 is an oxide-nitride-oxide (ONO) layer. The ONO layer will serve as isolation between the floating gate and control gate of the memory cell.

A second polysilicon layer is formed over interpoly layer 125. This second polysilicon layer will be used to form the control gate (see control gates 123 and 128 in FIG. 1) for the memory cell. This control gate may be formed using various different techniques, some of which are described below. Cross-sectional views are shown in FIGS. 15–18 where control gate 123 is formed from the second polysilicon layer using different techniques. FIGS. 15–18 only show the cross-sections for a portion of the trench, where the other portion of the trench would be a mirror image of this portion. As described earlier, two transistor memory cells, mirror images of another, may be fabricated in the trench region, across from another. As a brief summary, FIGS. 15–18 show the result the processing steps to form trench 101. Gate oxide (115 and 116) is grown over the substrate. The first polysilicon is masked and spacer etched to form floating gate 118. Drain region 108 and source regions 112 are formed. An interpoly dielectric 126 is grown over floating gate 118. The second polysilicon if grown over the substrate.

Shown in FIG. 5 is the result of defining the control gate using standard masking and etch steps. Specifically, the second polysilicon layer is masked to define the control gate regions. The second polysilicon layer is etched to reveal the control gates. During etching, the second polysilicon layer is separated at the bottom of the trench 1503A and at the top of the trench 1503B. As a result of this technique of processing, control gate 123 has an overhang region 1510 and leg region 1520. Overhang region 1510 and leg region 1520 increase the lateral dimensions of the memory cell because memory cells may not be laved out as closely and compactly.

Figure 15:
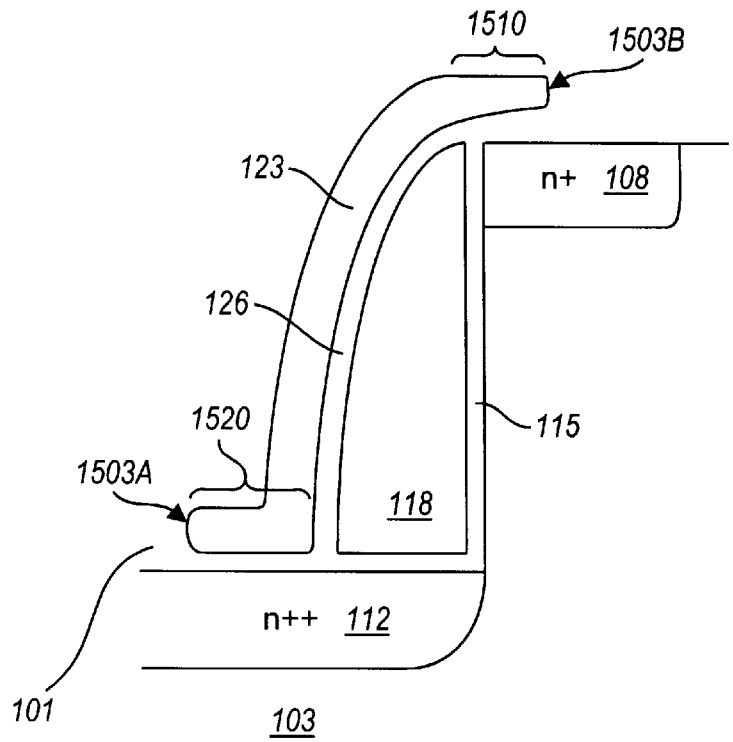
FIG. 15 is a cross-section showing the result after mask and etch steps to form a control gate.
Figure 16:
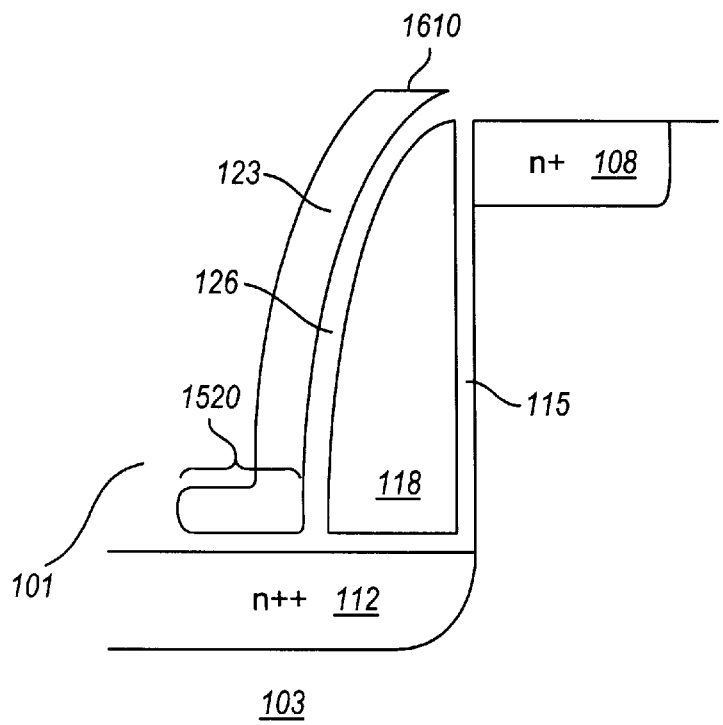
FIG. 16 is a cross-section showing the result after mask and etch steps, and a polish step to form a control gate.

To achieve a slightly more compact memory cell layout, the result from the processing shown in FIG. 15 may be further processed. After etching to define the control gate regions, a polish step may be used to remove overhang region 1510, as shown in FIG. 16. The polish step would planarize the substrate and remove overhang region 1510, resulting in a control gate with a relatively planar top 1610, taking less lateral area. However, leg region 1520 remains. The polish step may be performed using a chemical-mechanical polish (CMP), where the surface of the substrate is mechanically ground with a slurry mixture.

Figure 17:
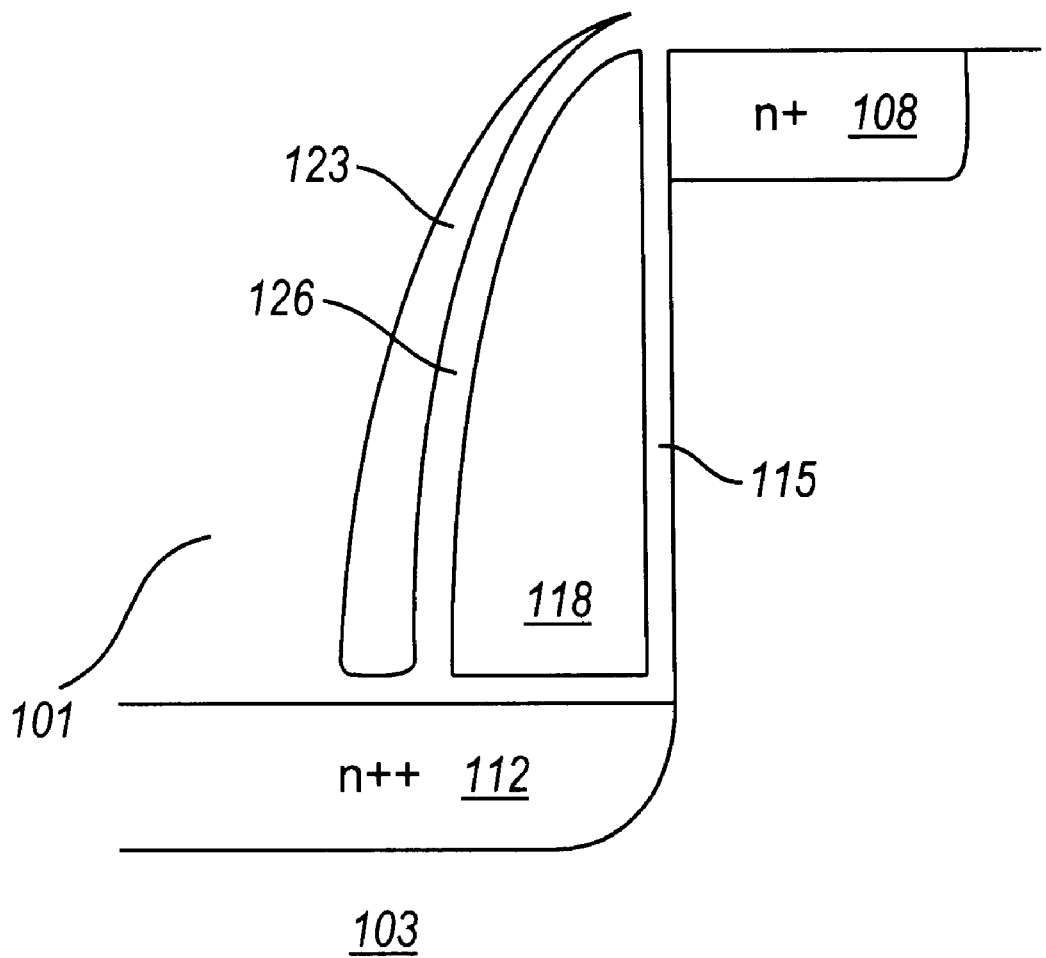
FIG. 17 is a cross-section showing the result of forming a control gate using a polysilicon spacer and spacer etch.

An even more compact memory cell layout may be achieved by depositing a second polysilicon spacer for the second polysilicon. The second polysilicon spacer will be spacer etch to reveal the control gate 123. This result is shown in FIG. 17. There is no overhang region and no leg region. This technique provides a very compact memory cell layout. This is a second spacer processing step since the floating gate was also formed using spacer processing. A spacer polysilicon on spacer polysilicon process, compared to the previously described techniques, is somewhat more difficult to implement, but should be used to minimize the overall memory cell size.

After the control gate is formed, a passivation layer may be formed to cover the memory cell as a barrier for moisture and charge penetration. The passivation layer may be silicon nitride, BPSG, or other insulating barrier material.

The foregoing description of preferred embodiments of the invention has been presented for the purposes of illustration and description. It is not intended to be exhaustive or to limit the invention to the precise form described, and many modifications and variations are possible in light of the teaching above. The embodiments Were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A method of programming a memory cell comprising:
   placing a control gate at a high voltage;
   placing a first active region at a first potential, wherein the first active region is formed in a substrate;
   placing a second active region at a second potential, below the first potential, whereby electrons flow in a channel from the second active region to the first active region in a direction transverse to a top surface of the substrate; and
   trapping hot electrons in a floating gate.

2. The method of claim 1 wherein the trapping of electrons occurs when hot electrons jump a dielectric barrier along a sidewall.

3. The method of claim 1 wherein the high voltage is above the first potential.

4. The method of claim 1 further comprising:
   altering a threshold voltage of the memory cell to be in a high VT state.

5. The method of claim 1 wherein the second active region is formed beneath a trench containing the memory cell.

6. The method of claim 1 wherein the hot electrons are trapped by indirect electron scattering.

7. The method of claim 1 wherein the second active region is coupled directly to a metal conductor.

8. The method of claim 1 wherein the first potential is above a supply voltage of an integrated circuit within which the memory cell is embodied.

9. The method of claim 1 wherein the first potential is between six and seven volts.

10. The method of claim 1 wherein the first potential is ground to minimize the number of hot electrons accumulated in the floating gate.

11. The method of claim 3 wherein the high voltage is between twelve and fourteen volts.

12. The method of claim 1 further comprising:
    placing the memory cell into a high threshold voltage (VT) state by accumulating electrons in the floating gate.

13. The method of claim 12 wherein the high VT state is characterized by the memory cell remaining in an off state when a voltage within a predetermined range is applied at the control gate.

14. The method of claim 13 wherein the predetermined range is within supply voltages of an integrated circuit within which the memory cell is embodied.

15. The method of claim 1 wherein the second potential is ground.

16. The method of claim 1 further comprising:
    initializing the memory cell into a low threshold voltage (VT) state.

17. The method of claim 1 further comprising:
    removing electrons from the floating gate to place the memory cell in an initialized state.

18. The method of claim 17 wherein the second active region is formed beneath a trench containing the memory cell, and wherein the removing electrons comprises:
    placing the second active region at a third potential;
    placing the control gate and the first active region at a fourth potential, below the third potential; and
    attracting the electrons from the floating gate through a dielectric barrier along a bottom of the trench.

19. The method of claim 18 wherein the third potential is above a supply voltage of an integrated circuit within which the memory cell is embodied.

20. The method of claim 18 wherein the fourth potential is ground.

21. A method of programming a plurality of memory cells within an integrated circuit comprising:

selecting a subset of the plurality of the memory cells for programming;

placing control gates of the selected memory cells at a high voltage;

placing first active regions of the selected memory cells at a first potential, wherein the first active regions are formed in a substrate;

placing second active regions of the selected memory cells at a second potential, wherein the second potential is less than or equal to the first potential, whereby for each of the selected memory cells electrons flow from the second active region to the first active region in a direction transverse to a surface of the substrate; and trapping hot electrons in floating gates of the selected memory cells by indirect electron scattering.

22. The method of claim 21 wherein the memory cells are selected to distribute programming currents within the integrated circuit.

23. The method of claim 21 wherein the memory cells selected for programming are evenly distributed in an array.

24. The method of claim 21 wherein the plurality of memory cells are arranged in a grid, and wherein memory cells within a row or a column of the grid are selected for programming.

25. A method of programming a memory cell comprising:

placing a first active region at a first potential, wherein the first active region is formed in a substrate;

placing a second active region at a second potential, wherein the second potential is less than or equal to the first potential, wherein the first and second active regions are coupled by a channel along a sidewall that is transverse to a surface of the substrate;

placing a control gate at a third voltage, wherein the third voltage is higher than the first and second voltages; and accumulating electrons on a floating gate, wherein the floating gate is parallel to the sidewall.

26. The method of claim 25 wherein the accumulating electrons comprises:

inducing a high flow of electrons from the second active region to the first active region; and trapping hot electrons that jump a dielectric barrier along the sidewall.

27. The method of claim 25 wherein the second active region is formed beneath a trench containing the memory cell.

28. The method of claim 25 wherein the accumulating electrons comprises:

tunneling electrons from the second active region to the floating gate through a dielectric barrier along a bottom of the trench.

29. The method of claim 25 further comprising:

placing the memory cell into a high threshold voltage (VT) state through accumulation of electrons in the floating gate.

30. The method of claim 29 wherein the memory cell is fabricated in an integrated circuit that operates from a supply voltage, and wherein the high VT state is characterized by the memory cell remaining in an off state when a voltage lower than the supply voltage is applied at the control gate.

31. The method of claim 25 further comprising:

removing electrons from the floating gate to place the memory cell in an initialized state.

32. The method of claim 31 wherein the removing electrons comprises:

placing the second active region at a third potential;

placing the control gate and the first active region at a fourth potential, below the third potential; and attracting the electrons from the floating gate through the dielectric barrier along a bottom of the trench.

* * * * *